US009059257B2

(12) United States Patent
Li et al.

(10) Patent No.: US 9,059,257 B2
(45) Date of Patent: Jun. 16, 2015

(54) SELF-ALIGNED VIAS FORMED USING SACRIFICIAL METAL CAPS

(71) Applicant: International Business Machines Corporation, Armonk, NY (US)

(72) Inventors: Juntao Li, Guilderland, NY (US); Chih-Chao Yang, Glenmont, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/041,187

(22) Filed: Sep. 30, 2013

(65) Prior Publication Data

US 2015/0091181 A1  Apr. 2, 2015

(51) Int. Cl.
*H01L 21/44* (2006.01)
*H01L 21/768* (2006.01)
*H01L 23/48* (2006.01)

(52) U.S. Cl.
CPC ........ *H01L 21/76879* (2013.01); *H01L 23/481* (2013.01)

(58) Field of Classification Search
CPC ..................... H01L 21/0228; H01L 21/28194; H01L 21/28556; H01L 21/8238; H01L 51/105
USPC ......... 438/598, 618, 104, 513, 602, 603, 604, 438/608, 680, 712, 745, 769, 692; 257/E21.006, E21.058, E21.126, 257/E21.127, E21.129, E21.17, E21.218, 257/E21.231, E21.229, E21.267, E21.279, 257/E21.293, E21.304, E21.311, E21.545, 257/E21.546, E21.547, E21.548
See application file for complete search history.

(56) References Cited

U.S. PATENT DOCUMENTS

| 5,614,765 | A | 3/1997 | Avanzino et al. |
|---|---|---|---|
| 5,795,823 | A | 8/1998 | Avanzino et al. |
| 6,225,211 | B1 | 5/2001 | Tsui |
| 6,281,585 | B1 | 8/2001 | Bothra |
| 6,812,040 | B2 | 11/2004 | Kyler et al. |
| 7,514,361 | B2 | 4/2009 | Bonilla et al. |
| 7,745,282 | B2 | 6/2010 | Yang et al. |
| 7,858,513 | B2 | 12/2010 | Mohapatra et al. |
| 7,998,864 | B2 | 8/2011 | Yang et al. |
| 8,039,966 | B2 * | 10/2011 | Yang et al. ............ 257/773 |
| 8,138,604 | B2 | 3/2012 | Yang et al. |
| 8,299,625 | B2 | 10/2012 | Ponoth et al. |
| 2005/0191767 | A1 * | 9/2005 | Edwards et al. ............ 438/4 |

FOREIGN PATENT DOCUMENTS

EP            0599592        11/1993

* cited by examiner

*Primary Examiner* — David Nhu
(74) *Attorney, Agent, or Firm* — Yuanmin Cai; Steven M. Kellner

(57) ABSTRACT

A method including forming a sacrificial metal cap on a metal line formed in a first dielectric layer; forming a second dielectric layer on the first dielectric layer; removing the sacrificial metal cap selective to the second dielectric layer and metal line to form a cap opening; forming a dielectric cap in the cap opening and on the metal line; forming an interconnect dielectric layer over the dielectric cap and the second dielectric layer; forming an interconnect opening in the interconnect dielectric layer; removing a portion of the dielectric cap exposed by the interconnect opening selective to the interconnect dielectric layer, the second dielectric layer, and the metal line; and forming an interconnect structure in the interconnect opening, the interconnect structure comprising a contact line above a via, the via having an upper via portion with angled sidewalls and a lower via portion with substantially vertical sidewalls.

13 Claims, 11 Drawing Sheets

SELF-ALIGNED VIAS FORMED USING SACRIFICIAL METAL CAPS

The present invention relates generally to the fabrication of integrated circuits, and more particularly, to a structure and method for fabricating self-aligned vias using sacrificial metal caps grown on metal lines through a selective deposition process.

BACKGROUND

Integrated circuit (IC) chips typically include multiple levels of conductive features which are vertically spaced apart and separated by intermediate insulating layers. Interconnections are formed between the levels of conductive features in the chip to provide high wiring density and good thermal performance. The interconnections are formed using lines and vias, which are etched through the insulating layers separating the levels conductive features of the device. Within a typical interconnect structure, metal vias run perpendicular to the semiconductor substrate, while metal lines run parallel to the semiconductor substrate. The lines and vias are then filled with a conductive material, typically a conductive metal such as copper.

Interconnects are commonly formed through a photolithography process, commonly referred to as a damascene process, that includes the deposition of a patternable masking layer (i.e., "photoresist"). A typical damascene process includes: depositing a dielectric material over a layer containing metal lines (i.e., "$M_x$ layer"); patterning of the dielectric material using photoresist to form via and trench openings; deposition of a conductive material in sufficient thickness to fill the openings to form a via layer (i.e., "$V_x$ layer") and a contact layer (i.e., "$M_{x+1}$ layer") there over; and removal of the excessive conductive material from an upper surface of the dielectric material using a chemical reactant-based process, mechanical methods, or a combined chemical mechanical polishing (CMP) techniques.

Some damascene techniques, such as trench first damascene, may produce vias that are self-aligned perpendicular to a trench in the $M_{x+1}$ layer but not self-aligned in the direction along the trench in the $M_{x+1}$ layer. Poor alignment between the vias and the metal lines is due in part to uncontrolled chamfer formation in the vias of the $V_x$ layer. This uncontrolled chamfer formation occurs during etching due to the variability of etch rates and limits of etch precision. Because the chamfered sides of a via extend to an upper surface of a line that is usually in close proximity to another line, uncontrolled via chamfer formation can lead to a sub-optimal or sub-critical distance between a non-corresponding via and line. In some cases, the via may actually be in contact with the non-corresponding metal line. A sub-optimal or sub-critical distance between non-corresponding vias and lines can lead to problems in a device such as shorting, poor electrical yield, and low reliability. Accordingly, it may be desirable to overcome the deficiencies and limitations described hereinabove.

SUMMARY

According to one embodiment, a method is provided. The method may include forming a sacrificial metal cap on a metal line formed in a first dielectric layer; forming a second dielectric layer on the first dielectric layer, the second dielectric layer being adjacent to and contacting a sidewall of the sacrificial metal cap; removing the sacrificial metal cap selective to the second dielectric layer and metal line to form a cap opening, the cap opening having substantially the same width as the metal line; forming a dielectric cap in the cap opening and on the metal line; and forming an interconnect dielectric layer over the dielectric cap and the second dielectric layer. The sacrificial metal cap may be formed by depositing a metal cap only on exposed surfaces of the metal line through a selective deposition process.

In another embodiment, a method is provided. The method may include forming a sacrificial metal cap on a metal line formed in a first dielectric layer; forming a second dielectric layer on the first dielectric layer, the second dielectric layer being adjacent to and contacting a sidewall of the sacrificial metal cap; removing the sacrificial metal cap selective to the second dielectric layer and metal line to form a cap opening, the cap opening having substantially the same width as the metal line; forming a dielectric cap in the cap opening and on the metal line; forming an interconnect dielectric layer over the dielectric cap and the second dielectric layer; forming an interconnect opening in the interconnect dielectric layer, the interconnect opening extending from an upper surface of the interconnect dielectric layer to an upper surface of the dielectric cap and an upper surface of the second dielectric layer; removing a portion of the dielectric cap exposed by the interconnect opening selective to the interconnect dielectric layer, the second dielectric layer, and the metal line; and forming an interconnect structure in the interconnect opening. The interconnect structure may include a contact line above a via. The via may have an upper via portion with angled sidewalls and a lower via portion with substantially vertical sidewalls. The sacrificial metal cap may be formed by depositing a metal cap only on exposed surfaces of the metal line through a selective deposition process.

In another embodiment, a structure is provided. The structure may include a metal line in a first dielectric layer; a second dielectric layer above the first dielectric layer; an interconnect dielectric layer above the second dielectric layer; and an interconnect structure. The interconnect structure may include a contact line and via. The contact line and an upper portion of the via having angled sidewalls may be in the interconnect dielectric layer and a lower portion of the via having substantially vertical sidewalls may be in the second dielectric layer. The lower portion of the via may be above the metal line and may have a width that is equal to or less than the width of the metal line.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

The embodiments of the present invention relate generally to the fabrication of integrated circuits, and more particularly to a structure and method for fabricating self-aligned vias using sacrificial metal caps grown on metal lines through a selective deposition process. An embodiment by which to reduce the risk of shorting between non-corresponding vias and lines in interconnect structures, and to increase electrical yield and reliability, is described in detail below with reference to the accompanying drawings FIGS. 1-10. Another embodiment is described in detail below with reference to FIG. 11.

Figure 1:
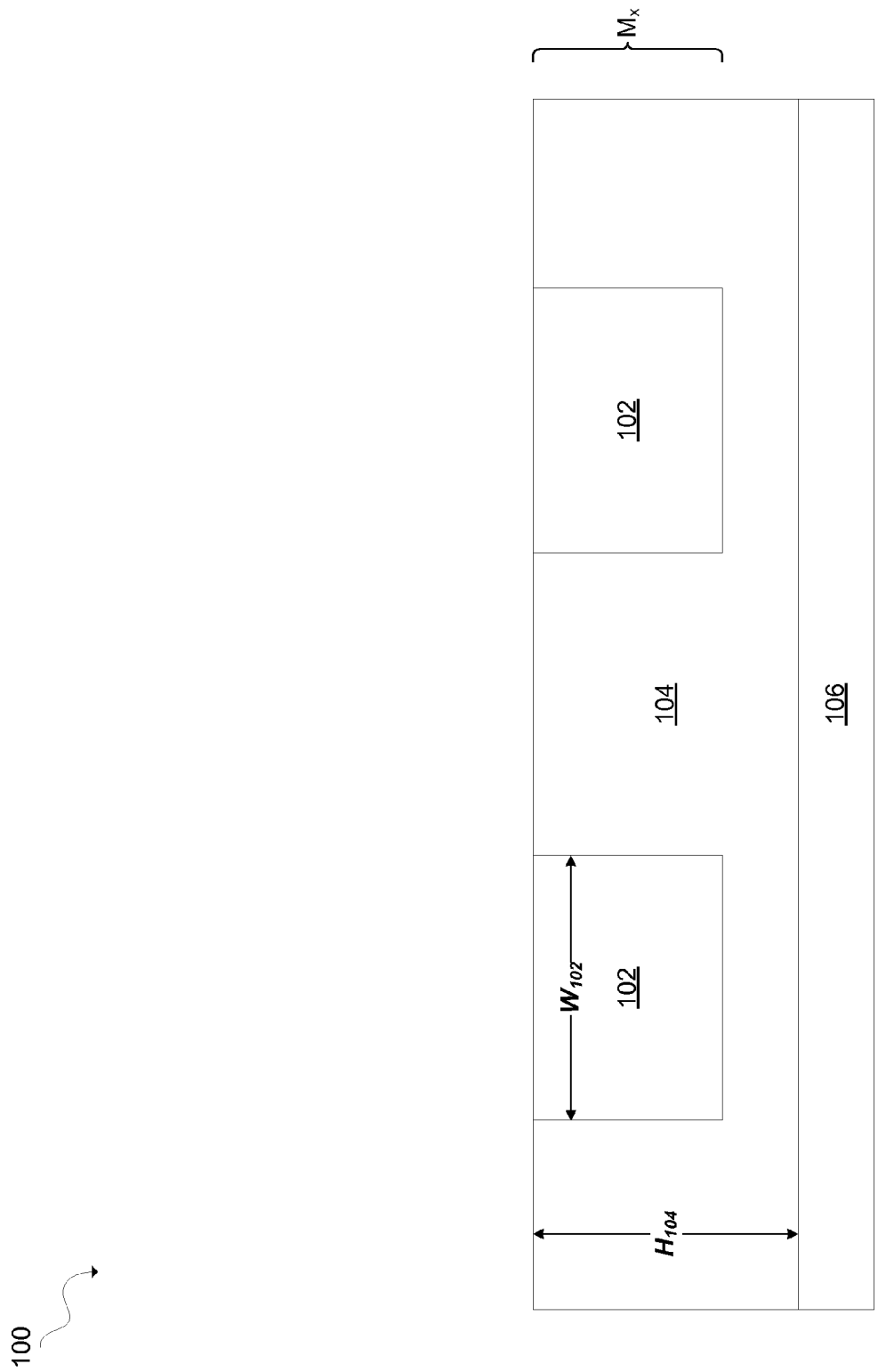
FIG. 1 is a cross sectional view illustrating forming metal lines in a first dielectric layer, according to an embodiment of the present invention.

Referring now to FIG. 1, a structure 100 illustrates forming metal lines 102 in a first dielectric layer 104. The first dielectric layer 104 may be formed over a semiconductor substrate 106.

The semiconductor substrate 106 may include a semiconducting material, an insulating layer, a conductive material, or any combination thereof, including multilayered structures. Thus, for example, the semiconductor substrate 106 can be a semiconducting material such as Si, SiGe, SiC, GaAs, InAs, InP, and other III/V or II/VI compound semiconductors. The semiconductor substrate 106 may also include a layered substrate such as, for example, Si/SiGe, Si/SiC, or semiconductor-on-insulators (SOIs). When the semiconductor substrate 106 contains an insulating layer, the insulating layer may be composed of an organic insulator, an inorganic insulator, or a combination thereof including multilayers.

When the semiconductor substrate 106 is composed of a conductive material, the semiconductor substrate 106 may include, for example, polySi, an elemental metal, alloys of elemental metals, a metal silicide, a metal nitride, and combinations thereof, including multilayers. When the semiconductor substrate 106 is composed of a semiconductor material, one or more semiconductor devices such as complimentary metal oxide semiconductor (CMOS) devices can be fabricated thereon. For clarity, the one or more semiconductor devices are not shown in the drawings of the present application.

The first dielectric layer 104 may be formed utilizing a conventional deposition process including, but not limited to, depositing dielectric material using molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. In one embodiment, a dielectric material may be deposited on the semiconductor substrate 106 using a blanket deposition process and then planarized using a conventional process such as, for example, chemical mechanical planarization (CMP) to form the first dielectric layer 104. The first dielectric layer 104 may be composed of one or more layers of dielectric materials that may be, but not necessarily always, in direct contact with each other.

In an embodiment, the first dielectric layer 104 may be composed of a low-k dielectric material including, but not limited to, an oxide and/or silicates. A "low-k" material is a dielectric material with a lower dielectric constant relative to silicon dioxide ($SiO_2$), which is 3.9 (i.e., the ratio of the permittivity of $SiO_2$ divided by the permittivity of a vacuum). Some examples of suitable low-k dielectric materials that may be used to form the first dielectric layer 104 include, but are not limited to: $SiO_2$; silsesquioxanes; C doped oxides (i.e., organosilicates) that include atoms of Si, C, O and H; and thermosetting polyarylene ethers. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In another embodiment, the first dielectric layer 104 may be composed of an ultra low-k dielectric material having a dielectric constant, k, of 2.7 or less. The first dielectric layer 104 may be porous or nonporous. The first dielectric layer 104 may be composed of materials including, but not limited to, organic polymers, low-k PECVD films containing Si, C, O, and H, and spin-on organosilicate glasses which have k values in the 2.7 to 2.0 range or lower. It is understood, however that other materials having an ultra low-k dielectric constant may be employed. The first dielectric layer 104 may also include multiple layers of dielectric material in any combination known in the art. In a preferred embodiment, the first dielectric layer 104 may have a height $H_{104}$ ranging from approximately 100 nm to approximately 800 nm.

The metal lines 102 may be formed in the first dielectric layer 104 through conventional etching and deposition techniques. To form the metal lines 102, openings (not shown) may be formed in the first dielectric layer 104 by depositing a photoresist material (not shown) on an upper surface of the first dielectric layer 104. The photoresist material (not shown) may be patterned by a photolithography process to provide a photoresist pattern and then etched using a process involving one or more steps to form the openings (not shown). The etching process may include a dry etching process such as reactive ion etching (RIE), ion beam etching, or plasma etching. The patterned photoresist may be removed after the first dielectric layer 104 is etched and the openings (not shown) are formed. The horizontal layer in which the metal lines 102 are present may be referred to as the "$M_x$ layer."

The openings (not shown) may then be filled with a conductive material using a conventional deposition process including, but not limited to, MBE, CVD, PECVD, ALD, evaporation, PVD, chemical solution deposition, and other like deposition processes. The conductive material may then be planarized so that an upper surface of the conductive material is coplanar with an upper surface of the first dielectric layer 104. The conductive material used to fill the openings (not shown) may include, but is not limited to: tungsten, copper, aluminum, silver, gold, alloys thereof, and any suitable combination of those materials using any of the deposition methods listed above. In one embodiment, a layer of liner material that can serve as a barrier to prevent a conductive material from diffusing there through may first be deposited on the walls of the openings (not shown) to form a liner layer (not shown) before filling the openings (not shown) with conductive material. Examples of materials suitable for use as the liner layer (not shown) may include, but is not limited to a refractory metal, such as Ti, Ta, W, Ru, a Co, or nitrides thereof (e.g., TiN, TaN, WN, RuN, and CoN). The liner layer (not shown) may have a thickness ranging from approximately 1 nm to approximately 50 nm. In a preferred embodiment, the metal lines 102 may be composed of copper and have width $W_{102}$ ranging from approximately 20 nm to approximately 500 nm.

Figure 2:
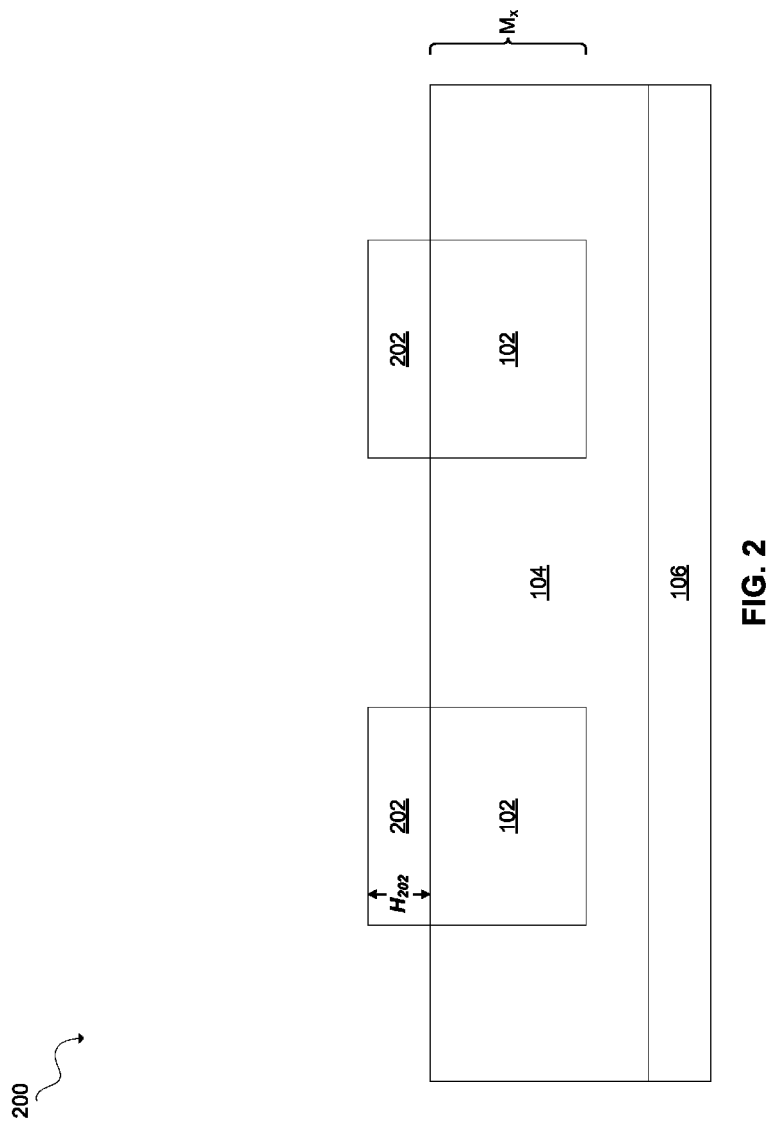
FIG. 2 is a cross sectional view illustrating forming metal caps on the metal lines through a selective deposition process, according to an embodiment of the present invention.

Referring now to FIG. 2, a structure 200 illustrates forming metal caps 202 on the metal lines 102 through a selective deposition process. In an embodiment, the metal caps 202 may be composed of metal and formed selectively on the metal lines 102. The entire top surface of the metal lines 102 (including any liner material, if present) may be covered by the metal caps 202. In a preferred embodiment, the metal caps 202 may have a height $H_{202}$ ranging from approximately 1 nm to approximately 50 nm. In one embodiment, the metal caps 202 may be composed of a material with a low electrical resistance ("low-R material") such as, for example, Co, Ru, CoWP, Cu, and W.

Selective deposition techniques that may be used to form the metal caps 202 include electroless deposition, CVD, and ALD, and may be conducted in a non-oxygen (i.e., no free O, $O_2$, or $O_3$) atmosphere. The selective deposition techniques according to embodiments of the present invention involve self-complimentary materials and are self-limiting depositions of a metal from a reactive vapor phase compound of the metal exclusively on an exposed metal, for example, Cu. In one embodiment, for example, Ru may be selectively deposited on Cu using a triruthenium dodecacarbonyl ($Ru_3(CO)_{12}$) precursor in a CVD reaction. In another embodiment, Co may be selectively deposited on Cu using a dicarbonyl (h5-2,4-cyclopentadien-1-yl)Co precursor in a CVD reaction.

Figure 3:
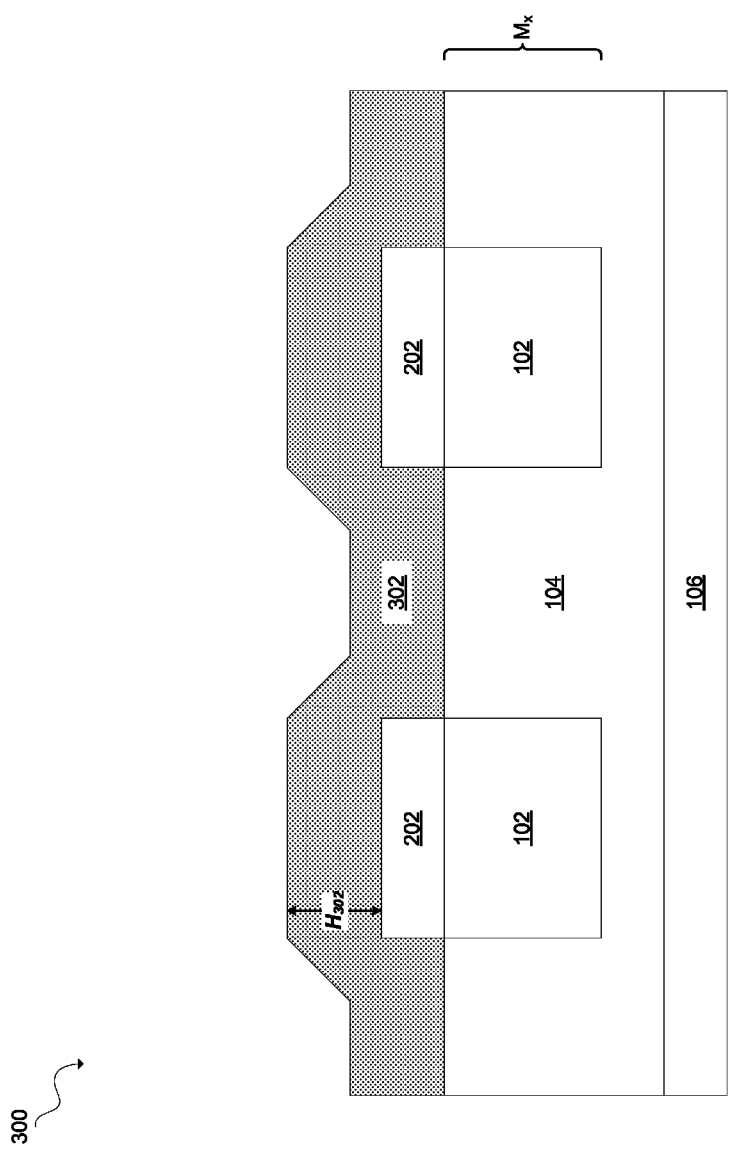
FIG. 3 is a cross sectional view illustrating forming a second dielectric layer over the first dielectric layer and the metal caps, according to an embodiment of the present invention.

Referring now to FIG. 3, a structure 300 illustrates forming a second dielectric layer 302 over the first dielectric layer 104 and the metal caps 202. The second dielectric layer 302 may be substantially similar to the first dielectric layer 104 and formed using similar techniques as those used to form the first dielectric layer 104 as described above with reference to FIG. 1. In a preferred embodiment, the second dielectric layer 302 may have a height $H_{302}$ ranging from approximately 1 nm to approximately 50 nm.

Figure 4:
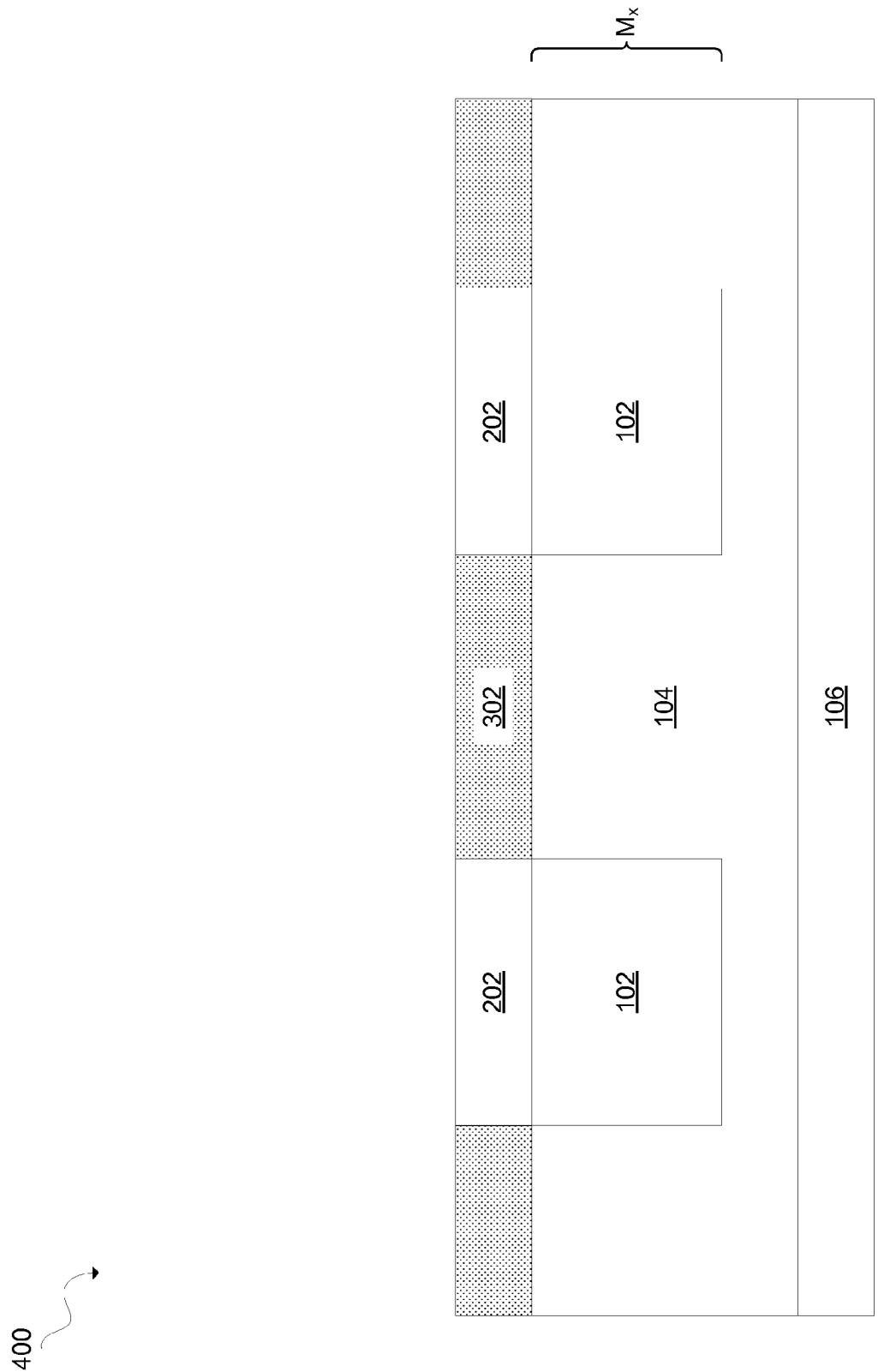
FIG. 4 is a cross sectional view illustrating removing a portion of the second dielectric layer, according to an embodiment of the present invention.

Referring now to FIG. 4, a structure 400 illustrates removing a portion of the second dielectric layer 302 so that an upper surface of the second dielectric layer 302 is substantially coplanar with an upper surface of the metal caps 202. The portion of the second dielectric layer 302 may be removed though a conventional planarization process such as, for example, CMP.

Figure 5:
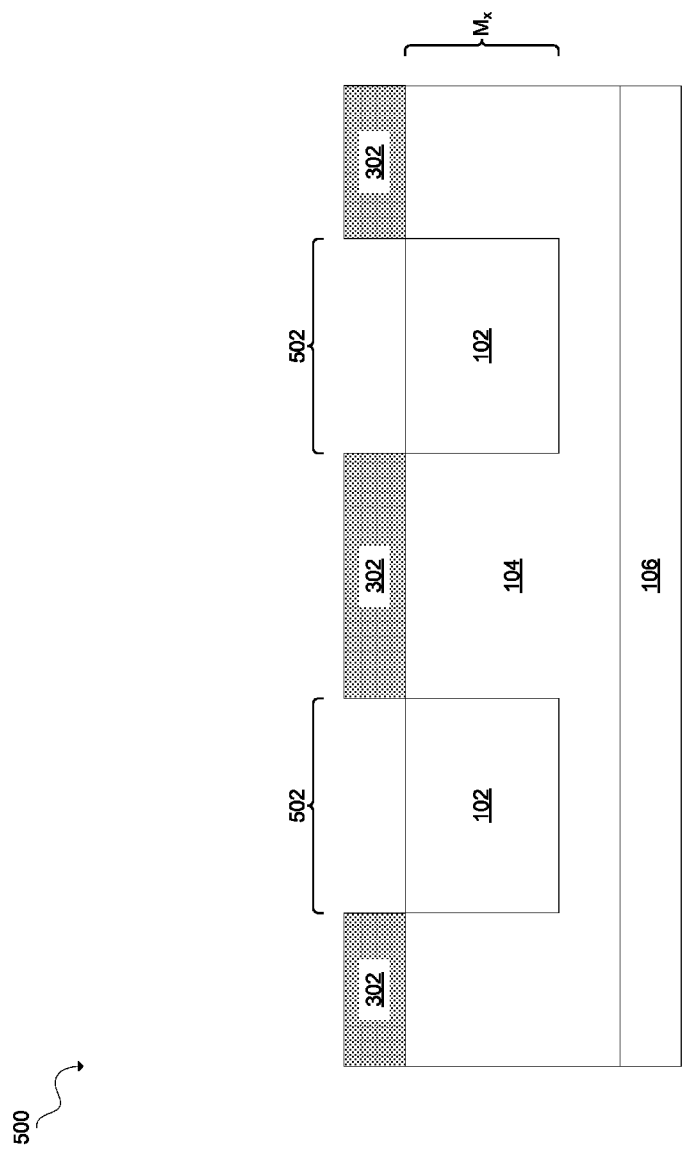
FIG. 5 is a cross sectional view illustrating removing the metal caps, according to an embodiment of the present invention.

Referring now to FIG. 5, a structure 500 illustrates selectively removing the metal caps 202 (FIG. 4), to form cap openings 502. A selective etching process may be used to remove only the metal caps 202 (FIG. 4) and not remove any of the second dielectric layer 302 or metal lines 102. In one embodiment, a conventional dry etching process such as reactive ion etching (RIE), sputter etching, or vapor phase etching may be used to selectively remove substantially all of the metal caps 202 (FIG. 4). In another embodiment, a conventional wet etching process utilizing a solution that is selective to the metal caps 202 (FIG. 4) may be used to remove substantially all of the metal caps 202 (FIG. 4).

Figure 6:
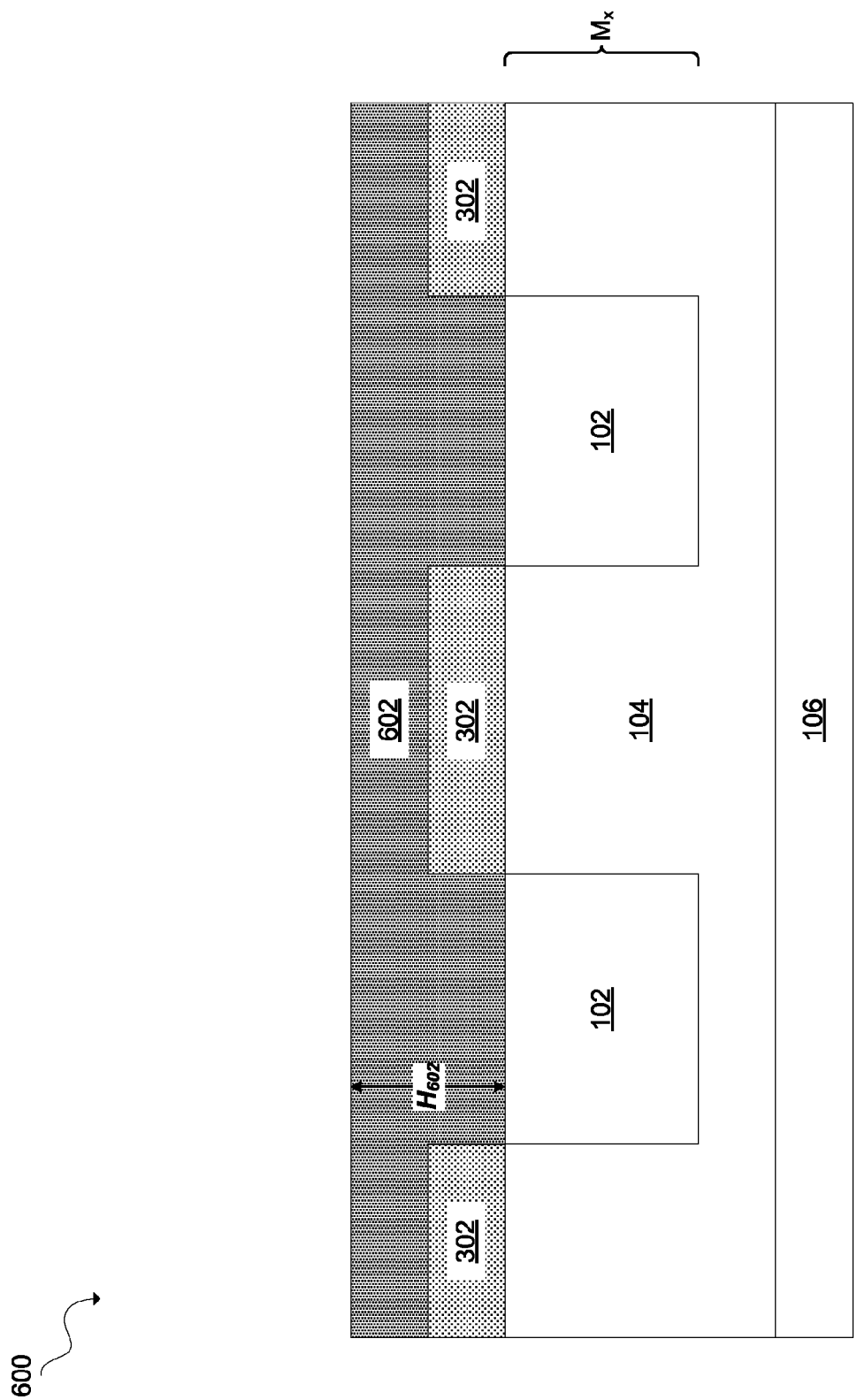
FIG. 6 is a cross sectional view illustrating forming a third dielectric layer on the second dielectric layer and the metal lines, according to an embodiment of the present invention.

Referring now to FIG. 6, a structure 600 illustrates forming a third dielectric layer 602 on the second dielectric layer 302 and the metal lines 102, filling the openings 502 (FIG. 6). The third dielectric layer 602 may be formed utilizing a conventional deposition process including, but not limited to, depositing dielectric material using MBE, CVD, PECVD, ALD, evaporation, PVD, chemical solution deposition, and other like deposition processes. In one embodiment, the third dielectric layer 602 may be composed of a dielectric material containing SiN or H-rich SiN. In another embodiment, the dielectric layer 602 may be composed of a low-k dielectric material that may include, but is not limited to, nitrides and/or silicates. Some examples of suitable low-k dielectric materials that may be used to form the third dielectric layer 602 include, but are not limited to: $Si_3N_4$, $SiO_2$, $Si(O, N)$, and $Si(O, N, H)$. In a preferred embodiment, the third dielectric layer 602 may have a height $H_{602}$ ranging from approximately 1 nm to approximately 50 nm. In one embodiment, the third dielectric layer 602 may be composed of a different material than the second dielectric layer 302. In another embodiment, the third dielectric layer 602 may be composed of a different material than second dielectric layer 302 and the first dielectric layer 104.

Figure 7:
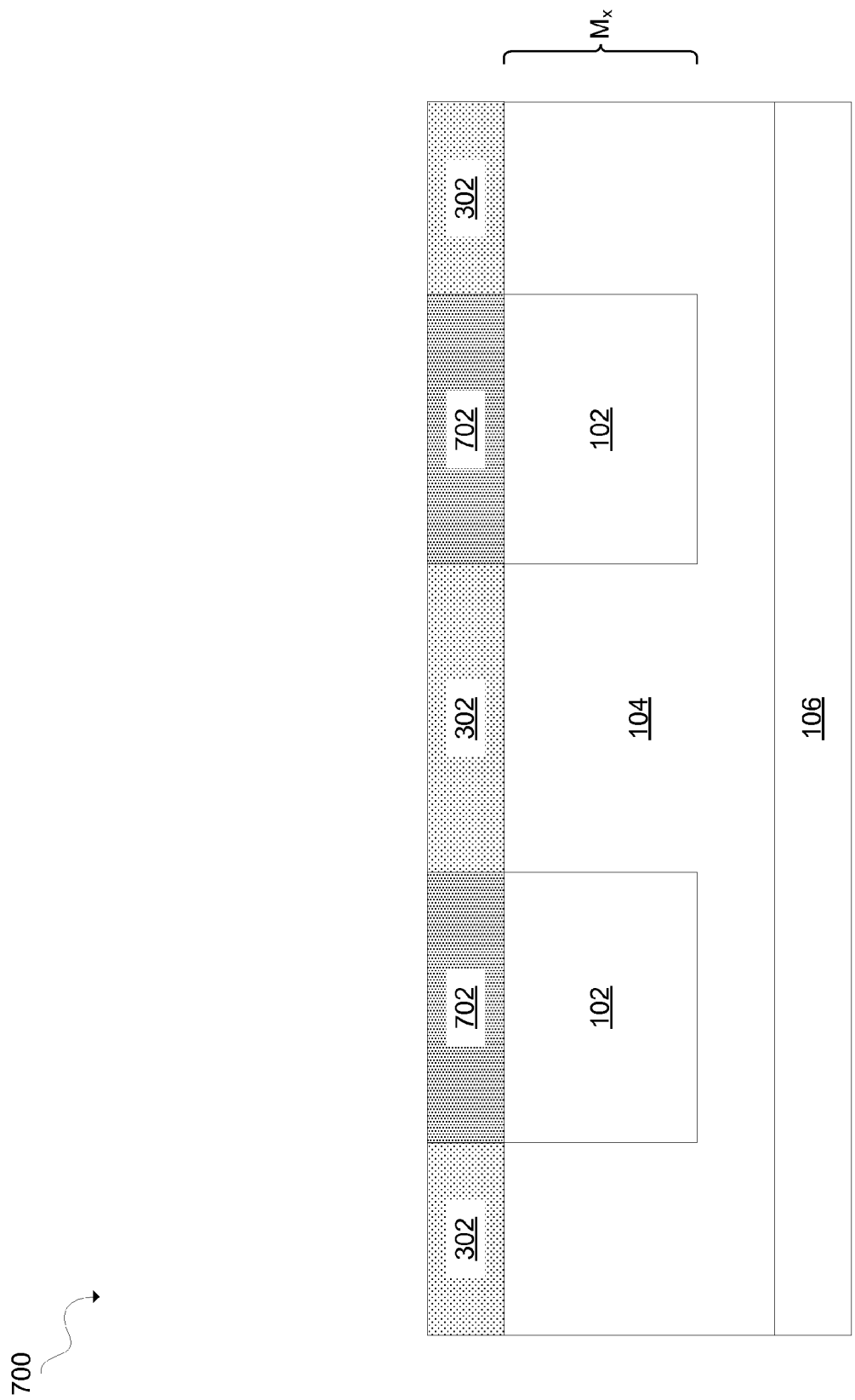
FIG. 7 is a cross sectional view illustrating removing a portion of the third dielectric layer so that a portion remains over the metal lines as dielectric caps, according to an embodiment of the present invention.

Referring now to FIG. 7, a structure 700 illustrates removing a portion of the third dielectric layer 602 (FIG. 6), so that a portion remains over the metal lines 102, forming dielectric caps 702. The portion of the third dielectric layer 602 (FIG. 6) may be removed by a conventional planarization process such as, for example, CMP. In an embodiment, an upper surface of the dielectric caps 702 may be substantially coplanar with the upper surface of the second dielectric layer 302.

Figure 8:
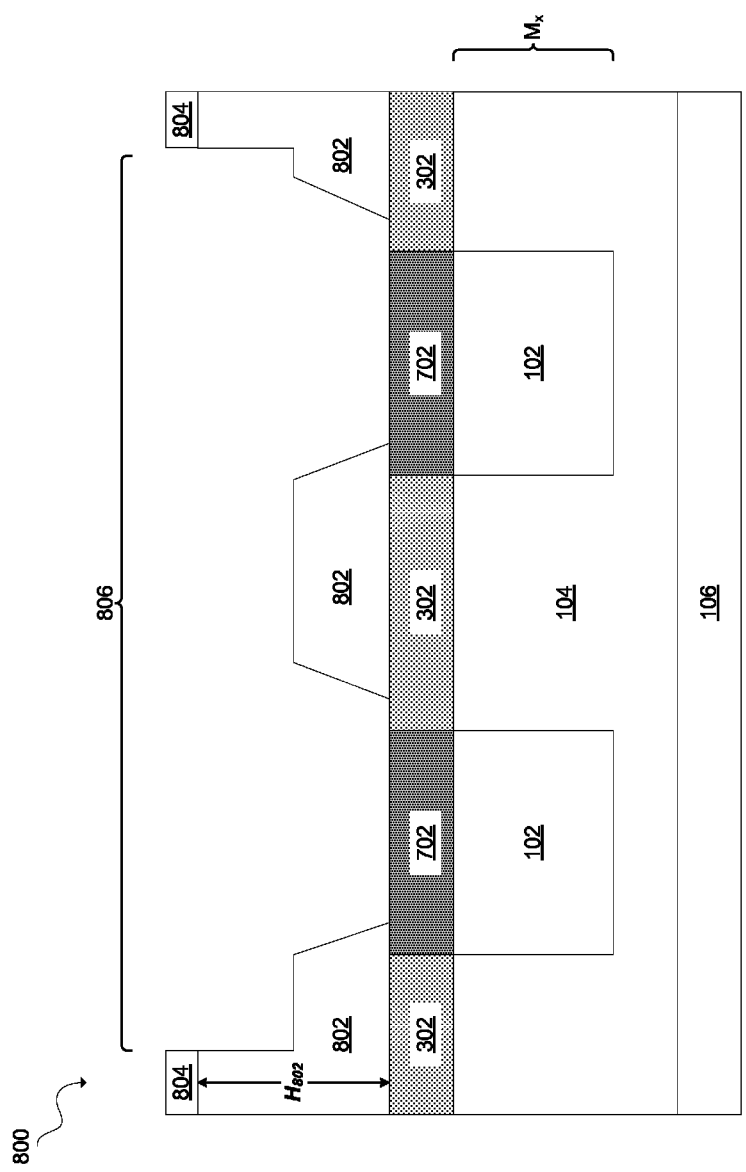
FIG. 8 is a cross sectional view illustrating forming a fourth dielectric layer and hardmask layer and performing an etching process to form an interconnect opening, according to an embodiment of the present invention.

Referring now to FIG. 8, a structure 800 illustrates forming an interconnect dielectric layer 802 and hardmask 804 over the second dielectric layer 302 and dielectric caps 702, and performing a damascene etching process to form an interconnect opening 806. In an embodiment, the fourth dielectric layer 802 may be substantially similar to the first dielectric layer 104 and formed using similar techniques as those used to form the first dielectric layer 104 as described above with reference to FIG. 1. In a preferred embodiment, the fourth dielectric layer 802 may have a height $H_{802}$ ranging from approximately 50 nm to approximately 1000 nm. The hard mask 804 may be composed of nitride, such as for, example, TiN. The hard mask 804 may be formed by utilizing a conventional deposition process including, but not limited to, depositing dielectric material using MBE, CVD, PECVD, ALD, evaporation, PVD, chemical solution deposition, and other like deposition processes.

The interconnect opening 806 may be formed by a conventional damascene process (i.e., patterning the hardmask 804 through a photolithography process and then etching the interconnect dielectric layer 802 using a etching process that may include one or more steps). In an embodiment, the interconnect opening 806 may be formed using a conventional dual damascene process, such as for example, trench first dual damascene. The etching process may include a dry etching process such as reactive ion etching (RIE), ion beam etching, or plasma etching. It should be noted that during the etching process used to form the interconnect opening 806, the fourth dielectric layer 802 may be removed selective to the second dielectric layer 302 and the dielectric caps 702.

Figure 9:
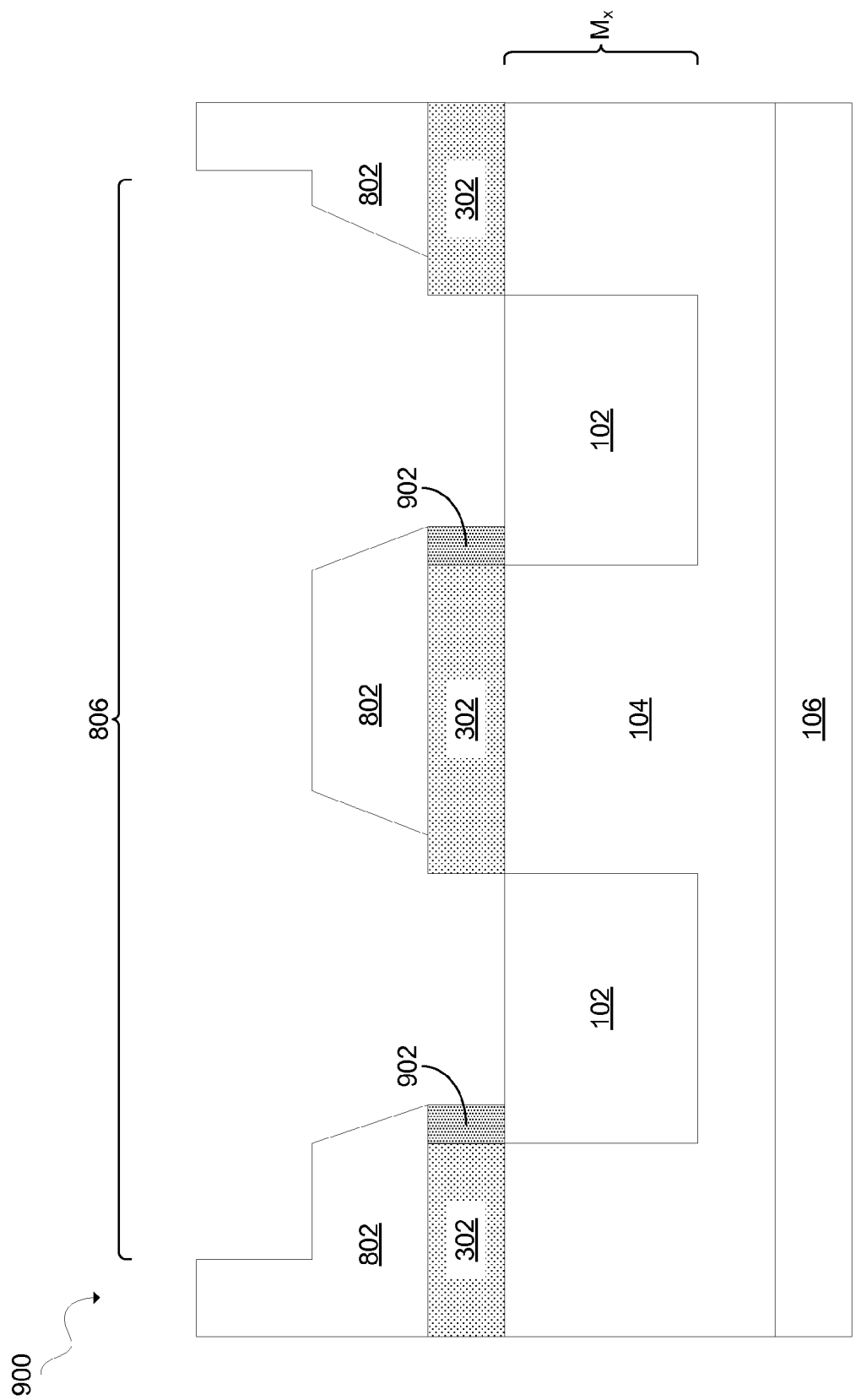
FIG. 9 is a cross sectional view illustrating removing the hardmask layer and exposed portions of the dielectric caps, according to an embodiment of the present invention.

Referring now to FIG. 9, a structure 900 illustrates removing the hardmask 804 (FIG. 8) and removing exposed portions of the dielectric caps 702 (i.e., portions of the dielectric caps 702 exposed through the formation of the interconnect opening 806). Unexposed portions of the dielectric caps 702 may remain on the metal lines 102 as dielectric cap portions 902. The hardmask 804 (FIG. 8) may be removed by a conventional etching process or through a conventional planarization process, such as CMP. The exposed portions of the dielectric caps 702 may be removed by a selective etching process. A conventional dry etching process, such as RIE, sputter etching, or vapor phase etching may be used to selectively remove substantially all of exposed portions of the dielectric caps 702 selective to the interconnect dielectric layer 802, the second dielectric layer 302, and the metal lines 102. In one embodiment, a conventional wet etching process may be used with a solution that is selective to the dielectric caps 702 to remove substantially all of the exposed portions of the dielectric caps 702 selective to the interconnect dielectric layer 802, the second dielectric layer 302, and the metal lines 102.

Figure 10:
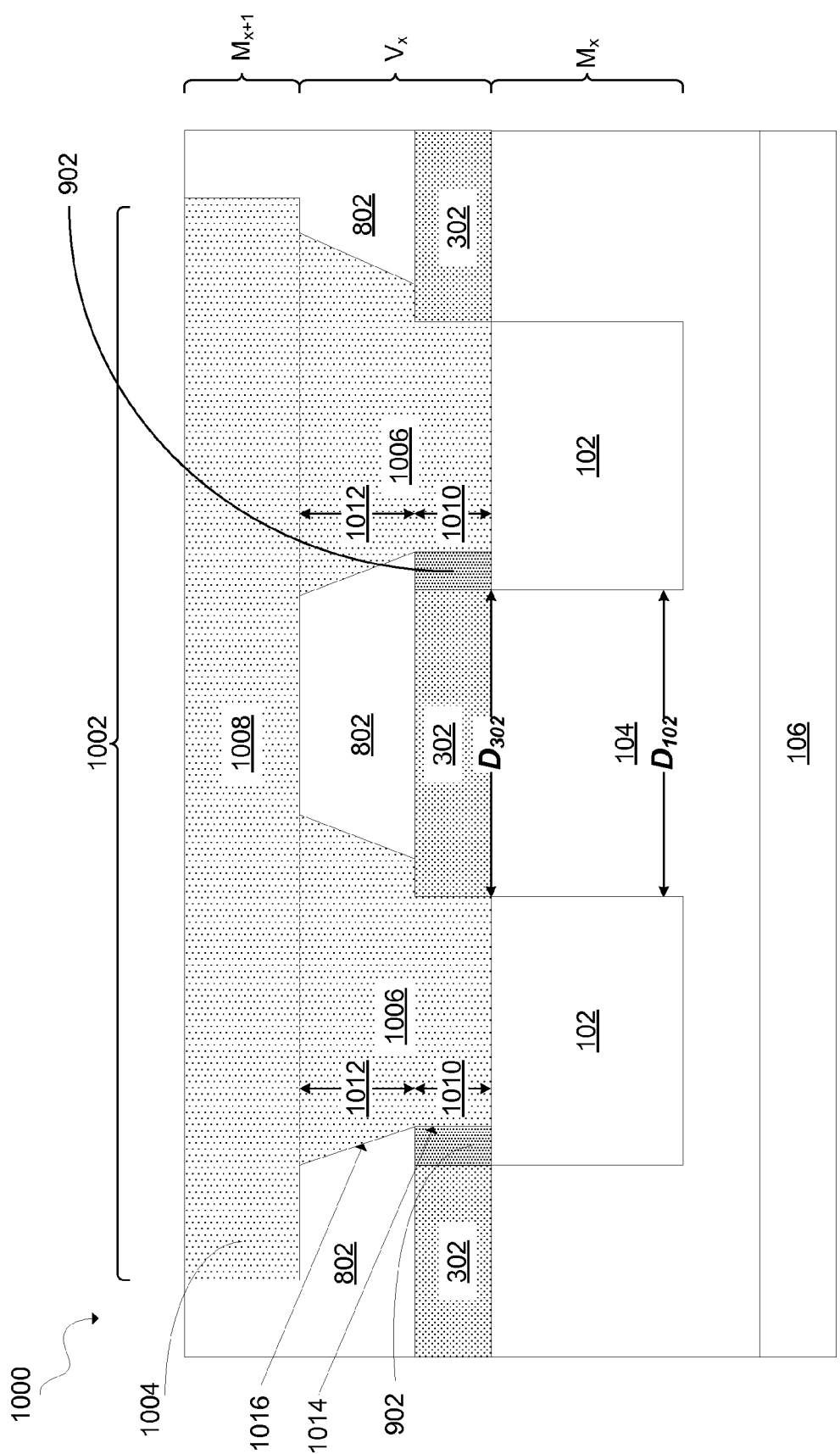
FIG. 10 is a cross sectional view illustrating forming an interconnect structure in which the $M_x$ layer and $M_{x+1}$ layer are perpendicular to one another, according to an embodiment of the present invention.

Referring now to FIG. 10, a structure 1000 illustrates filling the interconnect opening 806 (FIG. 9) with a conductive material 1004 to form an interconnect structure 1002 in which the $M_x$ and $M_{x+1}$ layers are perpendicular to one another. In one embodiment, the conductive material 1004 may be composed of a conductive metal, such as Al, Cu, or an alloy thereof. In one embodiment, a seed layer (not shown), preferably Cu or CuMn, may be formed in the interconnect opening 806 (FIG. 9) by evaporation or sputter deposition before the conductive material 1004 is deposited. In one embodiment, the conductive material 1002 may be deposited by electroplating.

In another embodiment, a liner (not shown) composed of one or more layers may be formed in the interconnect opening 806 (FIG. 9) before the conductive material 1004 is deposited. In one embodiment, the liner (not shown) may be composed of a first layer containing tantalum nitride (TaN) and a second layer containing tantalum (Ta). In another embodiment, the liner (not shown) may be composed of a first layer containing titanium nitride (TiN) and a second layer containing titanium (Ti). In yet another embodiment, the liner (not shown) may be composed of a first layer containing tungsten nitride (WN) and a second layer containing tungsten (W). In yet another embodiment, the liner (not shown) may be composed of a first layer containing ruthenium nitride (RuN) and a second layer containing ruthenium (Ru).

After filling the interconnect opening 806 (FIG. 9) with the conductive material 1004, a planarization process such as, for example, CMP, may be performed so that an upper surface of the interconnect structure 1002 is substantially coplanar with an upper surface of the fourth dielectric layer 802.

The interconnect structure 1002 may be composed of vias 1006 (present in a $V_x$ layer) and a contact line 1008 (present in a $M_{x+1}$ layer). Because the second dielectric layer 302 is not etched during the formation of the interconnect opening 806 (FIG. 8), the vias 1006 may have a via upper portion 1012 with chamfered (i.e., angled) sidewalls 1016 and a via lower portion 1010 with substantially vertical sidewalls 1014. The via lower portion 1010 may extend from an upper surface of the metal lines 102 to an upper surface of the second dielectric layer 302. The via upper portion 1012 may extend from the upper surface of the second dielectric layer 302 to the contact line 1008. The via lower portion 1010 may have a width that is equal to or less than the width of the metal line 102 on which it is located. In an embodiment in which the via lower portion 1010 has a width less than the width of the corresponding metal line 102, a dielectric cap portion 902 may be present on the metal line 102 adjacent to and contacting the via lower portion 1010. It is contemplated that embodiments may include vias 1010 having: only a via lower potion 1010 with a width equal to the width of metal lines 102; only a via lower portion 1010 with a width less than the width of the metal lines 102; or a combination thereof.

The shape of the via lower portion 1010, the presence of the second dielectric layer 302, and the dielectric cap portions 902 may reduce the risk of uncontrolled chamfering of via sidewalls and shorting between a via and a non-corresponding line. Because the second dielectric layer 302 remains intact, the distance $D_{302}$ between a via lower portion 1010 and a non-corresponding line 102 may be no less than approximately the distance $D_{102}$ between the lines 102 themselves. In addition, the presence of the second dielectric layer 302 and the remaining the dielectric portions 902 may limit chamfer formation to only the via upper portion 1012. In other words, in an embodiment, a via in the $V_x$ layer may be self aligned to the metal line in the $M_x$ layer underneath, thereby reducing the $V_x/M_x$ overlay error that occurs in conventional techniques. In addition, the vias may be self aligned to the contact line 1008 in the $M_{x+1}$ by the hardmask 804.

Figure 11:
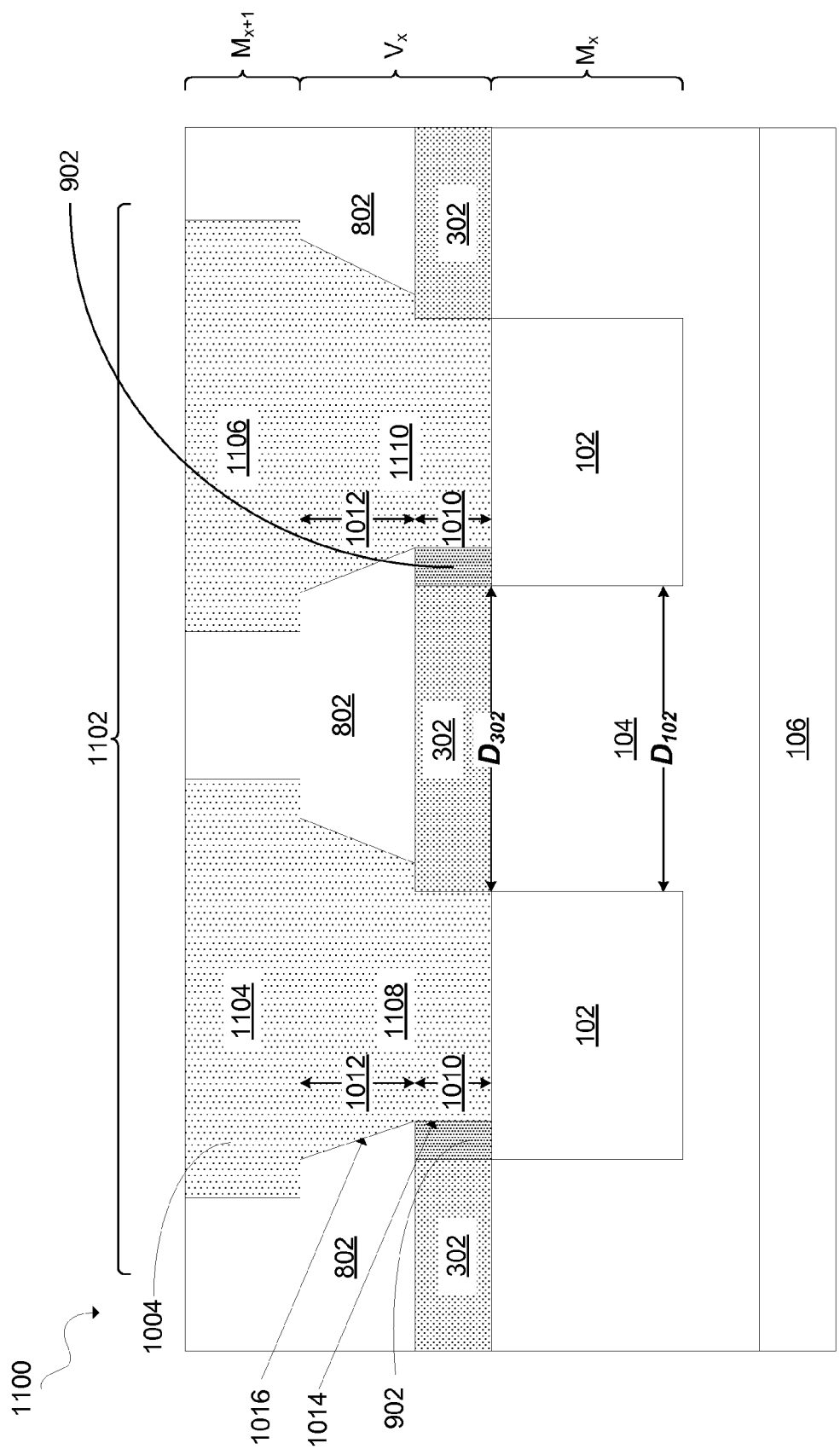
FIG. 11 is a cross sectional view illustrating forming an interconnect structure in which the $M_x$ layer and $M_{x+1}$ layer are in parallel, according to another embodiment of the present invention.

Referring now to FIG. 11, a structure 1100 illustrates an embodiment in which the $M_x$ layer and $M_{x+1}$ layer of an interconnect structure 1102 are in parallel. Structure 1100 may be substantially similar to structure 1000 with the exception of the $M_{x+1}$ layer and formed using similar techniques as those used to form structure 1000 as described above with reference to FIGS. 1-10 with the exception of the masking pattern used to form the interconnect opening 806 as described above with reference to FIG. 8. In this embodiment, the interconnect dielectric layer 802 is patterned and etched so that the $M_{x+1}$ layer of the interconnect structure 1102 contains a first contact line 1104 and a second contact line 1106. The first contact line 1104 and second contact line 1106 may be separated from each other by a portion of the interconnect dielectric layer 802. The first contact line 1104 corresponds to the first via 1108 directly below it. The second contact line 1106 corresponds to the second via 1110 below it. The first contact line 1104 and first via 1108 may be separate from the second contact line 1106 and second via 1110.

In one embodiment, the first via 1108 and the second via 1110 in the $V_x$ layer may be self aligned to the metal lines 102 in the $M_x$ layer due to the shape of the via lower portion 1010 and the presence of the second dielectric layer 302 and the dielectric cap portions 902. Because the second dielectric layer 302 remains intact, the distance $D_{302}$ between a via lower portion 1010 and a non-corresponding line 102 may be no less than approximately the distance $D_{102}$ between the lines 102 themselves. In addition, the presence of the second dielectric layer 302 and the dielectric cap portions 902 may limit chamfer formation to only the via upper portion 1012. In addition, the first via 1108 may be self aligned to the first contact line 1104 in the $M_{x+1}$ layer and the second via 1110 may be self aligned to the second contact line 1106 in the $M_{x+1}$ layer due to the hardmask (not shown) deposited on the interconnect dielectric layer 802 to form the interconnect structure 1102. The self alignment of the vias present in the $V_x$ layer to both the metal lines in the $M_x$ layer and the contact lines in the $M_{x+1}$ layer may reduce the $M_{x+1}$ layer/$M_x$ layer overlay offset that occurs in conventional techniques. In other words, the risk of shorting between a contact line in the $M_{x+1}$ layer and a non-corresponding metal line in the Mx layer (i.e., shorting between the first contact line 1104 and the metal line 102 below the second contact line 1106 and second via 1110) may be reduced.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for fabricating self-aligned vias formed using sacrificial caps, the method comprising:
    forming a sacrificial metal cap on a metal line formed in a first dielectric layer;
    forming a second dielectric layer on the first dielectric layer, the second dielectric layer being adjacent to and contacting a sidewall of the sacrificial metal cap;
    removing the sacrificial metal cap selective to the second dielectric layer and metal line to form a cap opening, the cap opening having substantially the same width as the metal line;
    forming a dielectric cap in the cap opening and on the metal line; and
    forming an interconnect dielectric layer over the dielectric cap and the second dielectric layer.

2. The method of claim 1, wherein the forming the sacrificial metal cap on the metal line formed in the first dielectric layer comprises:
    forming a metal cap only on exposed surfaces of the metal line through a selective deposition process.

3. The method of claim 1, wherein the sacrificial metal cap is comprised of a material having an etch rate different from the etch rates of the second dielectric layer and the metal line.

4. The method of claim 1, wherein the dielectric cap is comprised of a material having an etch rate different from the etch rates of the interconnect dielectric layer, the second dielectric layer, and the metal line.

5. The method of claim 1, wherein the second dielectric layer is comprised of a material having an etch rate different from the etch rates of the interconnect dielectric layer and the dielectric cap.

6. A method for fabricating self-aligned vias formed using sacrificial caps, the method comprising:
    forming a sacrificial metal cap on a metal line formed in a first dielectric layer;
    forming a second dielectric layer on the first dielectric layer, the second dielectric layer being adjacent to and contacting a sidewall of the sacrificial metal cap;
    removing the sacrificial metal cap selective to the second dielectric layer and metal line to form a cap opening, the cap opening having substantially the same width as the metal line;
    forming a dielectric cap in the cap opening and on the metal line;
    forming an interconnect dielectric layer over the dielectric cap and the second dielectric layer.
    forming an interconnect opening in the interconnect dielectric layer, the interconnect opening extending from an upper surface of the interconnect dielectric layer to an upper surface of the dielectric cap and an upper surface of the second dielectric layer;
    removing a portion of the dielectric cap exposed by the interconnect opening selective to the interconnect dielectric layer, the second dielectric layer, and the metal line; and
    forming an interconnect structure in the interconnect opening and on the metal line, the interconnect structure comprising a contact line above a via, the via having an upper via portion with angled sidewalls and a lower via portion with substantially vertical sidewalls.

7. The method of claim 6, wherein the forming the sacrificial metal cap on the metal line formed in the first dielectric layer comprises:
    forming a metal cap only on exposed surfaces of the metal line through a selective deposition process.

8. The method of claim 6, wherein the lower via portion extends from an upper surface of the metal wire to the upper surface of the second dielectric layer, and the upper via portion extends from the upper surface of the second dielectric layer to a bottom surface of the contact line.

9. The method of claim 6, wherein the forming an interconnect structure in the interconnect opening comprises:
    filling the interconnect opening with a conductive material; and
    performing a planarization process so that an upper surface of the conductive material is substantially coplanar with an upper surface of the interconnect dielectric.

10. The method of claim 6, wherein the lower via portion has a width that is equal to or less than the width of the metal line.

11. The method of claim 6, wherein the sacrificial metal cap is comprised of a material having an etch rate different from the etch rates of the second dielectric layer and the metal line.

12. The method of claim 6, wherein the dielectric cap is comprised of a material having an etch rate different from the etch rates of the interconnect dielectric layer, the second dielectric layer, and the metal line.

13. The method of claim 6, wherein the second dielectric layer is comprised of a material having an etch rate different from the etch rates of the interconnect dielectric layer and the dielectric cap.

* * * * *